United States Patent
Pan

[19]

[11] Patent Number: 6,100,592
[45] Date of Patent: Aug. 8, 2000

[54] INTEGRATED CIRCUITRY AND METHOD OF FORMING A CONTACT LANDING PAD

[75] Inventor: Pai-Hung Pan, Boise, Id.

[73] Assignee: Micron Technology, Inc., Boise, Id.

[21] Appl. No.: 08/946,034

[22] Filed: Oct. 7, 1997

Related U.S. Application Data

[62] Division of application No. 08/816,645, Mar. 13, 1997, Pat. No. 5,854,127.

[51] Int. Cl.[7] ............................ H01L 23/48; H01L 23/52; H01L 29/40; H01L 29/94

[52] U.S. Cl. ........................... 257/774; 257/382; 257/383; 257/384; 257/385

[58] Field of Search ..................................... 257/774, 750, 257/758, 382–385, 755; 438/300, 564

[56] References Cited

U.S. PATENT DOCUMENTS

| | | | |
|---|---|---|---|
| 5,170,233 | 12/1992 | Liu et al. | 257/308 |
| 5,206,183 | 4/1993 | Dennison | 437/47 |
| 5,227,325 | 7/1993 | Gonzalez | 437/52 |
| 5,229,326 | 7/1993 | Dennison et al. | 437/195 |
| 5,244,826 | 9/1993 | Gonzalez et al. | 437/60 |
| 5,318,927 | 6/1994 | Sandhu et al. | 438/3 |
| 5,323,038 | 6/1994 | Gonzalez et al. | 257/308 |
| 5,338,700 | 8/1994 | Dennison et al. | 437/60 |
| 5,391,511 | 2/1995 | Doan et al. | 438/396 |
| 5,401,681 | 3/1995 | Dennison | 437/60 |
| 5,438,011 | 8/1995 | Blalock et al. | 438/396 |
| 5,444,013 | 8/1995 | Akram et al. | 437/60 |
| 5,448,091 | 9/1995 | Bryant et al. | 257/755 |
| 5,563,089 | 10/1996 | Jost et al. | 438/396 |
| 5,581,093 | 12/1996 | Sakamoto | 257/382 |
| 5,604,147 | 2/1997 | Fischer et al. | 438/396 |
| 5,605,857 | 2/1997 | Jost et al. | 438/253 |
| 5,661,064 | 8/1997 | Figura et al. | 438/396 |
| 5,786,249 | 7/1998 | Dennison | 438/241 |

FOREIGN PATENT DOCUMENTS

| 4-10465 | 1/1992 | Japan | 257/755 |
|---|---|---|---|

OTHER PUBLICATIONS

U.S. application No. 07/869,615, Doan et al., filed Apr. 16, 1992.
U.S. application No. 08/044,824, Dennison et al., filed Apr. 7, 1993.
U.S. application No. 08/163,439, Dennison, filed Dec. 7, 1993.
U.S. application No. 08/622,591, Dennison, filed Mar. 26, 1996.
U.S. application No. 08/582,385, Sandhu et al., filed Jan. 3, 1996.
U.S. application No. 08/078,616, Lee et al., filed Jun. 17, 1993.
U.S. application No. 08/798,251, Parekh, filed Feb. 11, 1997.
U.S. application No. 08/798,242, Parekh et al., filed Feb. 11, 1997.
U.S. application No. 08/798,879, Parekh et al., filed Feb. 11, 1997.
U.S. application No. 08/798,241, Liu et al., filed Feb. 11, 1997.
U.S. application No. 08/799,492, Parekh, filed Feb. 11, 1997.

Primary Examiner—Mahshid Saadat
Assistant Examiner—Jhihan B Clark
Attorney, Agent, or Firm—Wells, St. John, Roberts, Gregory & Matkin P.S.

[57] ABSTRACT

Integrated circuitry and a method of forming a contact landing pad are described. The method includes, in one embodiment, providing a substrate having a plurality of components which are disposed in spaced relation to one another; forming a silicon plug spanning between two adjacent components; forming a refractory metal layer over the silicon plug and at least one of the components; reacting the silicon plug and the refractory metal layer to form a silicide layer on the silicon plug; and after forming the silicide layer removing unreacted refractory metal layer material from the substrate.

1 Claim, 3 Drawing Sheets

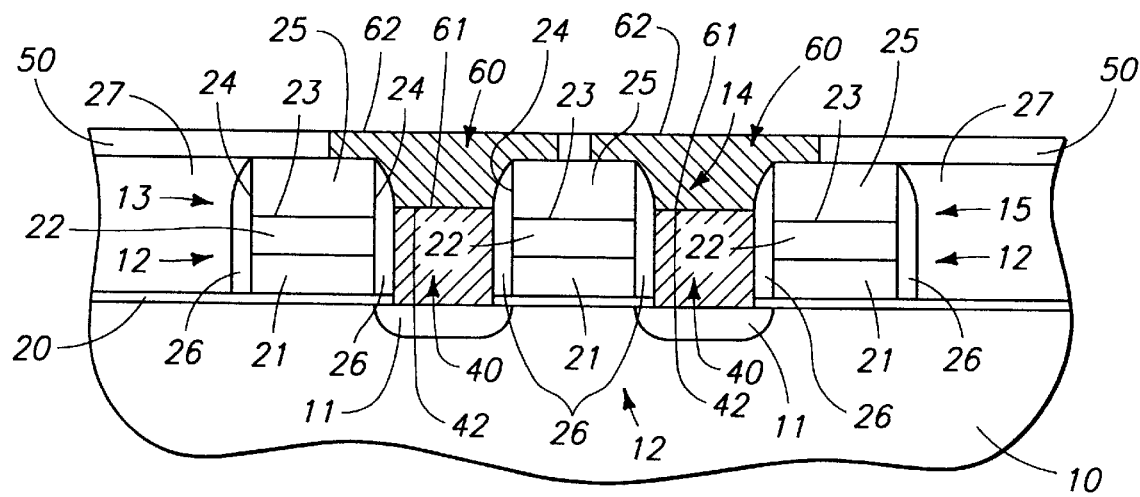
_FIG. 5_
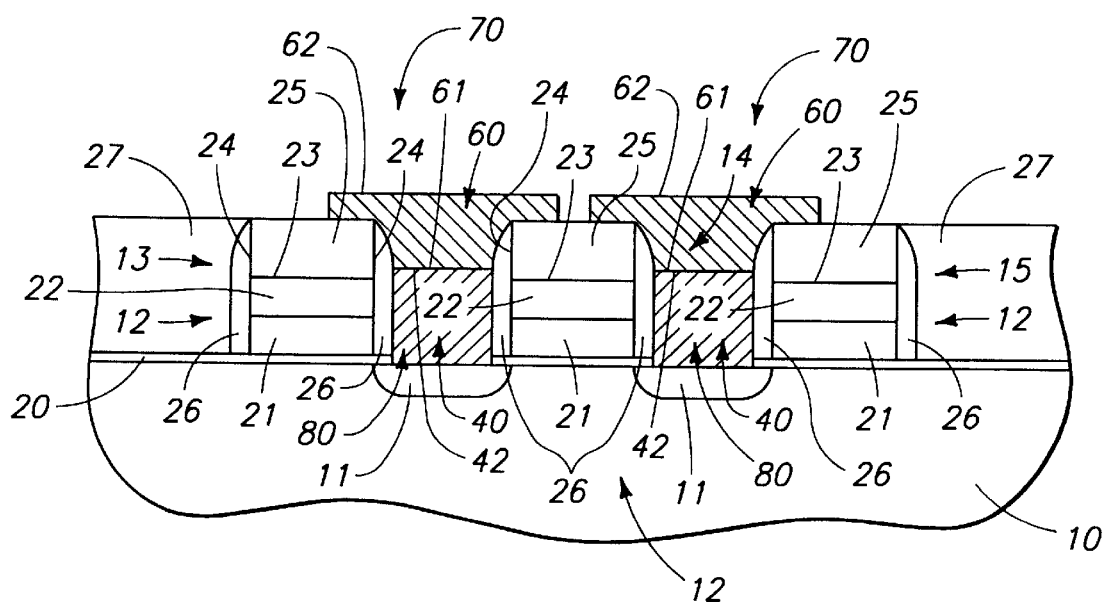
_FIG. 6_

INTEGRATED CIRCUITRY AND METHOD OF FORMING A CONTACT LANDING PAD

RELATED PATENT DATA

This is a divisional application claiming priority to U.S. patent application Ser. No. 08/816,645, filed Mar. 13, 1997, now U.S. Pat. No. 5,854,127, by Pai-Hung Pan., entitled "Integrated Circuitry and Method of Forming a Contact Landing Pad".

TECHNICAL FIELD

This invention relates generally to integrated circuitry and methods of forming a contact landing pad on a substrate.

BACKGROUND OF THE INVENTION

In the processing of integrated circuits, electrical contact must be made to isolated active device regions formed within a wafer substrate typically comprising monocrystalline. The active device regions are connected by highly conductive paths or lines which are fabricated above the wafer substrate in insulative material which covers the substrate surface. To provide electrical connection between the conductive path and active device regions, an opening in the insulator is provided to enable conductive material to contact the desired regions. Such openings are typically referred to as contact openings or simply contacts.

In an effort to substantially reduce or otherwise eliminate shallow junction leakage in the contact areas, fabricators of semiconductive devices have utilized polysilicon plugs. Following the formation of these plugs, fabricators have utilized an additional masking step to further define the polysilicon plug. This additional masking step insures, to some degree, that subsequent contact openings will be formed in a manner to open and land completely on the underlying polysilicon plug. As integrated circuits have decreased in size, it becomes increasingly difficult to properly align masks such that subsequent contact openings are formed properly, that is, which land completely on the underlying polysilicon plug.

A method which eliminates the need to have an additional masking step and also provides a means by which subsequent contact openings can be formed to land substantially on the underlying polysilicon plug is the subject matter of the present application.

BRIEF DESCRIPTION OF THE DRAWINGS

Preferred embodiments of the invention are described below with reference to the following accompanying drawings.

FIG. 5 is a view of the FIG. 1 wafer shown at a processing step subsequent to that shown by FIG. 4.

FIG. 6 is a view of the FIG. 1 wafer shown at a processing step subsequent to that shown by FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
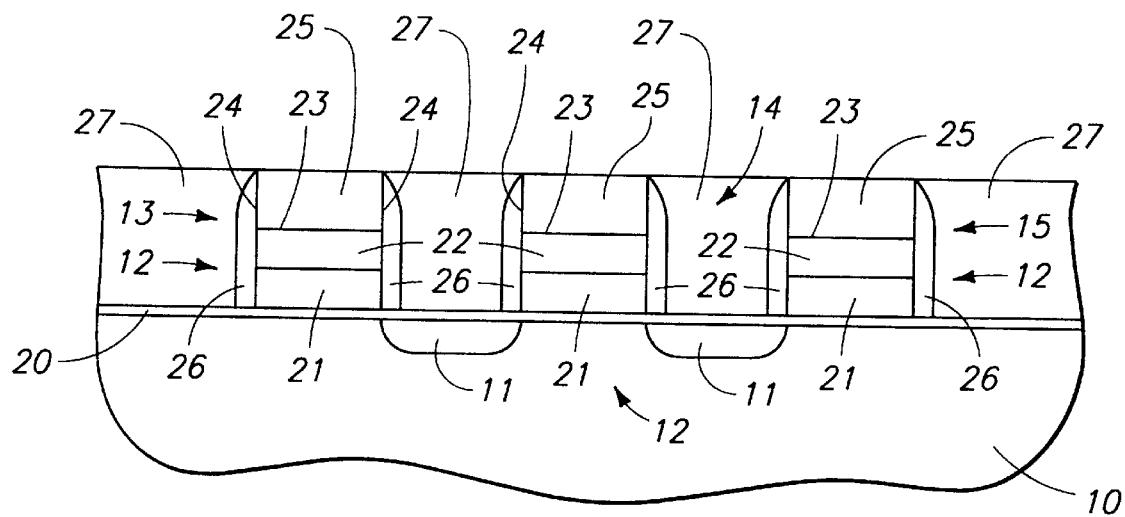
FIG. 1 is a diagrammatic sectional view of a semiconductor wafer at one processing step in accordance with the present invention.

Referring to FIG. 1, a semiconductor substrate in process is indicated generally with reference to numeral 10. In the context of this document, the term "semiconductor substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure including, but not limited, to the semiconductive substrates described above. The semiconductor substrate 10 has exemplary active contact regions 11 formed therein. Such active contact regions 11 constitute a node to which electrical connection is to be made. These contact regions have given length and width dimensions. A plurality of components 12 are formed in spaced relation on the semiconductor substrate 10. The plurality of components 12 comprise first, second and third gates 13, 14 and 15 respectively. Each of the gates includes a dielectric layer 20, which is provided atop the semiconductor substrate 10, a polysilicon layer 21 which is formed atop the dielectric layer, and a silicide layer 22 formed atop the polysilicon layer. The gates have respective top surfaces 23 and sidewall surfaces 24. An insulative nitride cap 25 is formed on each top surface 23. Further, the individual gates have insulative nitride sidewall spacers 26 formed on the sidewalls 24. A layer of BPSG 27 is formed outwardly of the gates 13, 14 and 15 and the semiconductor substrate 10. A subsequent planarization process, such as chemical mechanical polishing, or the like, is then utilized to remove excessive BPSG. The planarization process selected stops on the nitride caps 25.

Figure 2:
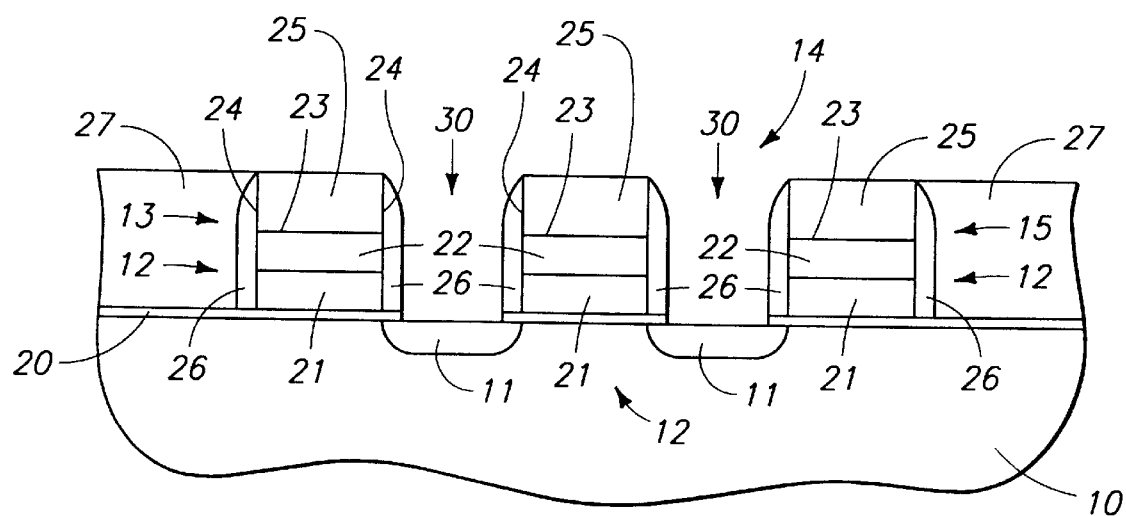
FIG. 2 is a view of the FIG. 1 wafer shown at a processing step subsequent to that shown in FIG. 1.

Referring now to FIG. 2, a masking layer, not shown, is formed outwardly of the semiconductor substrate 10 and an etch is subsequently conducted to define contact openings 30 between the individual components 12 to the underlying active contact regions 11.

Figure 3:
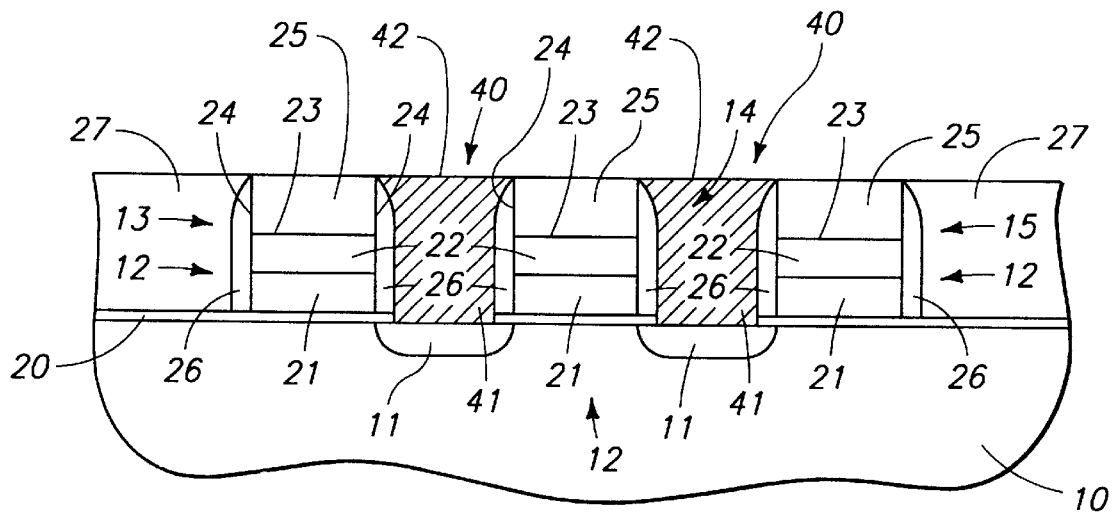
FIG. 3 is a view of the FIG. 1 wafer shown at a processing step subsequent to that shown by FIG. 2.

Referring now to FIG. 3, following a wafer cleaning process, a polysilicon layer 40 is formed outwardly of the respective gates 13, 14 and 15 and over the active contact regions 11. Following the formation of this polysilicon layer 40, a subsequent planarization process is utilized to remove excessive polysilicon material. The planarization process selected stops substantially on the nitride caps 25. The planarization process forms an inner silicon plug 41 which spans between at least two of the components 12. Each polysilicon plug 41 has a top or outer surface 42.

Figure 4:
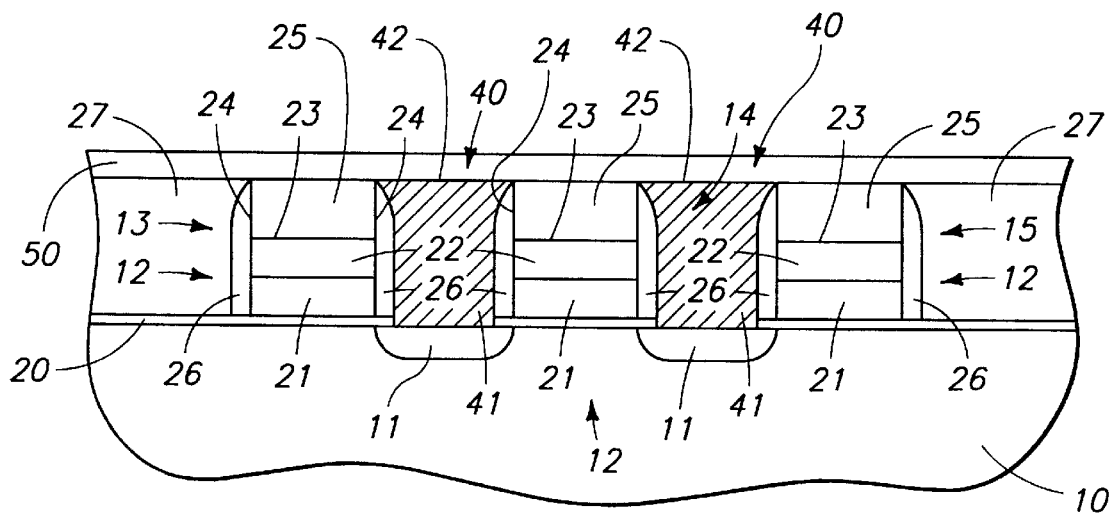
FIG. 4 is a view of the FIG. 1 wafer shown at a processing step subsequent to that shown by FIG. 3.

Referring now to FIG. 4, a refractory metal layer 50 comprising cobalt, tungsten, titanium or similar materials is formed outwardly of the semiconductor substrate 10 and over the silicon plugs 41 to a thickness of about 50 to about 200 Angstroms.

Referring now to FIG. 5, temperature and pressure conditions are provided which are effective to react the polysilicon layer 40 with the overlying refractory metal layer 50 to form an outer silicide layer or portion 60. The outer silicide layer has a first surface area 61 which joins with the top surface 42 (effectively moved inwardly from the reaction) of the inner silicon plugs 41. Additionally, the outer silicide layer has an elevationally outer second surface 62 which has a greater surface area than the surface area of the top surface 42. Example annealing conditions comprise a temperature of approximately 500 C. to about 700 C. and a time period of approximately one minute to about ten minutes. Such conditions result in the formation of an outer silicide layer 60 which is formed in partial covering relation relative to at least one of the components 12. The width of the laterally grown outer silicide layer is ideally controlled in an effort to match the worse case misalignment expected for subsequent masks.

Referring now to FIG. 6, after formation of the outer silicide layer 60, the remaining refractory metal layer material 50 is selectively stripped relative to the outer silicide layer 60 to define the resulting contact landing pad structures 70, and interconnecting plug portions 80.

The operation of the described method is believed to be readily apparent and is briefly summarized at this point.

A first aspect of the present invention is directed to a method of forming a contact landing pad on a substrate 10 comprising:

forming an active contact area 11 on the substrate 10; and forming a contact interconnecting plug 80 outwardly of and to the active contact area 11 through electrically insulative material 20, the plug 80 comprising an elevationally inner silicon portion 40 and an elevationally outer silicide portion 60.

Another aspect of the present invention relates to a method of forming a contact landing pad 70 comprising:

providing a substrate 10 having a plurality of components 12;

forming a silicon layer 40 spanning between two components 11; and growing a silicide layer 60 from the silicon layer 40 to extend laterally outwardly over the two components 12.

Still another aspect of the present invention relates to a method of forming a contact landing pad 70 comprising;

providing a substrate 10 having a silicon plug 41 projecting outwardly therefrom;

forming a refractory metal layer 50 outwardly of the substrate 10 and over the silicon plug 41; and reacting the silicon plug 41 and the refractory metal layer 50 to form a silicide layer 60 over the silicon plug 41.

Yet another aspect of the present invention relates to a method of forming a self-aligned contact landing pad 70 comprising:

providing a substrate 10 having a plurality of components 12 which are disposed in spaced relation to one another; forming a silicon plug 41 spanning between two adjacent components 12; and forming a layer of silicide 60 on the silicon plug 41 and in partial covering relation over at least one of the two adjacent components 12, the silicon plug 41 having a first surface area 42 which adjoins with the silicide layer 60, the silicide layer 60 having an outer second surface area 61, which is greater than the first surface area 42.

Another aspect of the present invention relates to a method of forming a self-aligned contact landing pad 70 comprising:

providing a substrate 10 having a plurality of components 42 which are disposed in spaced relation to one another;

forming a silicon plug 41 spanning between two adjacent components 12;

forming a refractory metal layer 50 over the silicon plug 41 and the components 12;

reacting the silicon plug 41 and the refractory metal layer 50 to form a silicide layer 60 on the silicon plug 41; and after forming the silicide layer 60, removing unreacted refractory metal layer material 50 from the substrate 10.

A further aspect of the present invention relates to a method of forming a contact landing pad 70 comprising:

providing a substrate 10 having adjacent spaced components 12;

forming a silicon layer 40 between the spaced components 12;

forming a refractory metal layer 50 over the silicon layer 40 and at least one of the spaced components 12; and annealing the substrate 10 under temperature and pressure conditions effective to react the silicon 40 and refractory metal 50 layers to form a silicide layer 60 on the silicon layer 40, the silicide layer 60 extending laterally outwardly over one of the spaced components 12.

Another aspect of the present invention relates to a method of forming a self-aligned contact landing pad comprising;

providing a substrate 10 having a plurality of gates 13, 14 and 15 with top and sidewall surfaces 23 and 24;

insulating 25 and 26 the top and sidewall surfaces of the gates 23 and 24;

forming a dielectric layer 27 outwardly of the substrate 10 and over the insulated 25 and 26 top and sidewall surfaces 23 and 24 of the gates 13, 14 and 15;

etching a contact opening 30 between adjacent gates 13 and 14 to the substrate 10;

forming a layer of silicon 40 in the contact opening 30;

forming a metal layer 50 over the layer of silicon 40 and over the dielectric layer 27;

providing conditions effective to react the refractory metal 50 and silicon layers 40 to form a silicide layer 60, the silicide layer 60 growing laterally outwardly relative to the silicon layer 40 and over the adjacent gates 13 and 14; and after forming the silicide layer 60, removing any unreacted metal layer material 50 from the substrate 10 to form the contact landing pad 70.

Another aspect of the present invention relates to an integrated circuit comprising:

a pair of spaced components 12 formed over a substrate 10;

a silicon plug 41 spanning between the pair of components 12; and a silicide layer 60 positioned over the silicon plug 41 and in at least partial covering relation over one of the components 12.

Another aspect of the present invention relates to an integrated circuit comprising;

a pair of spaced components 12 formed over a substrate 10;

a silicon plug 41 spanning between the pair of components 12; and a silicide layer 60 positioned on the silicon plug 41 and in partial covering relation over the two components 12.

Yet further, another aspect of the present invention relates to an integrated circuit comprising;

a substrate 10 having a plurality of components 12 which are disposed in spaced relation to one another;

a silicon plug 41 spanning between two adjacent components 12; and a layer of silicide 60 on the silicon plug 41 and which is disposed in at least partial covering relation over the two components 12, the silicon plug 41 having a first surface area 42 which joins with the silicide layer 60 and the silicide layer 60 having an elevationally outer second surface area 62 which is greater than the first surface area 42.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An integrated circuit, comprising:

a substrate having a plurality of adjoining gates with top and sidewall surfaces;

a nitride cap positioned in covering electrically insulating relation over and against each of the top surfaces of the respective gates, and wherein each nitride cap has an outwardly facing surface;

electrically insulative sidewall spacers positioned in covering electrically insulating relation over and against the sidewall surfaces of the respective gates, and wherein each of the sidewall spacers have an outwardly facing surface, and wherein a contact opening is defined between the outwardly facing surfaces of the sidewall spacers of the adjoining gates;

a layer of silicon positioned in the contact opening and filling a portion of the contact opening, and wherein the layer of silicon has an outwardly facing surface having a given surface area and which is substantially planar and which is located elevationally inwardly relative to the outwardly facing surface of nitride caps; and a silicide layer positioned against, and in covering relation relative to, the outwardly facing surface of the silicon layer, and in partial covering relation relative to the nitride caps of the adjoining gates, and wherein the silicide layer completely fills the remaining portion of the contact opening and has an inwardly facing surface area which is located elevationally outwardly of the top surface of each of the gates, and elevationally inwardly with respect to the top surface of the nitride caps, and a top surface which forms a contact landing pad which has a given surface area, and wherein the surface area of the contact landing pad is greater than the outwardly facing surface area of the layer of silicon.

* * * * *